United States Patent [19]

Shreeve et al.

[11] Patent Number: 4,987,365
[45] Date of Patent: Jan. 22, 1991

[54] METHOD AND APPARATUS FOR TESTING INTEGRATED CIRCUITS

[75] Inventors: Robert W. Shreeve; B. Dale Atwood, both of Corvallis, Oreg.

[73] Assignee: Hewlett-Packard Company, Palo Alto, Calif.

[21] Appl. No.: 344,885

[22] Filed: Apr. 28, 1989

[51] Int. Cl.⁵ .................................................. G01R 31/02
[52] U.S. Cl. .............................. 324/158 F; 324/158 P; 324/72.5
[58] Field of Search ............. 324/158 F, 150 P; 174/52.4, 68.5; 437/8; 29/825, 829, 876

[56] References Cited

U.S. PATENT DOCUMENTS

| | | | |
|---|---|---|---|
| 4,211,489 | 7/1980 | Kleinknecht et al. | 437/8 |
| 4,518,910 | 5/1985 | Hottenrott et al. | 324/158 F |
| 4,636,723 | 1/1987 | Coffin | 324/158 F |
| 4,716,124 | 12/1987 | Yerman et al. | 437/8 |
| 4,767,985 | 8/1988 | Shearer, Jr. et al. | 324/158 F |

*Primary Examiner*—Reinhard J. Eisenzopf
*Assistant Examiner*—Edward Urban

[57] ABSTRACT

A method and apparatus for testing an integrated circuit of the type which is mounted on a flexible strip and which includes a die in electrical communication with a plurality of test pads formed on the strip. In the method, a selected strip segment having an integrated circuit die mounted thereon is positioned against a substantially flat strip support member. A portion of the strip is compressed against the strip support member and thereafter a test probe is urged against each of selected test pads. The integrated circuit is tested and thereafter the probes are lifted from the pads, pressure is removed from the strip and the next integrated circuit is similarly tested.

21 Claims, 4 Drawing Sheets

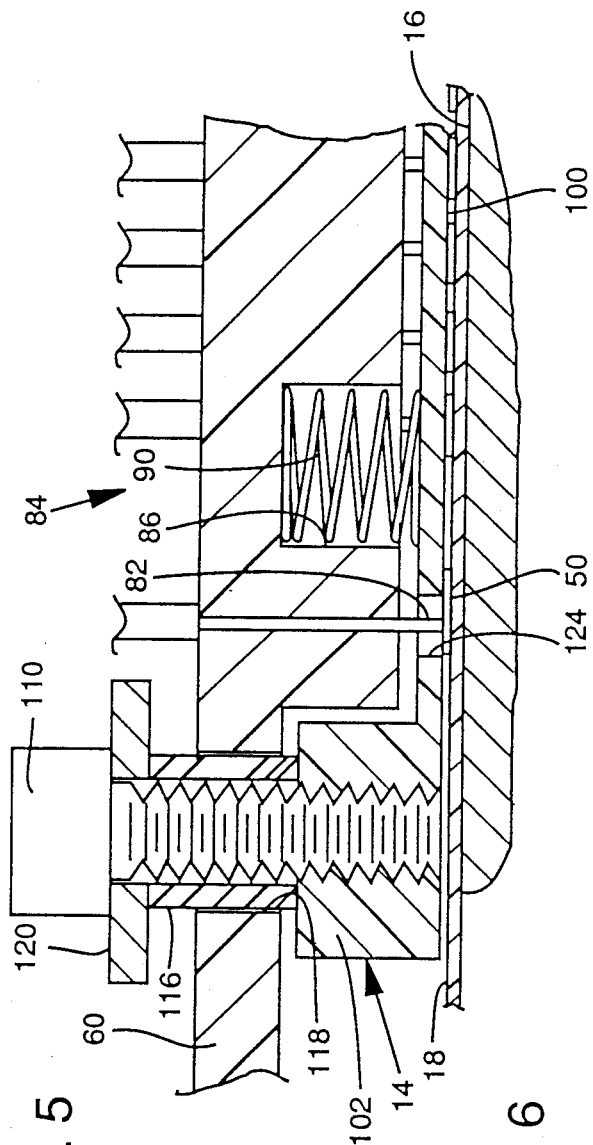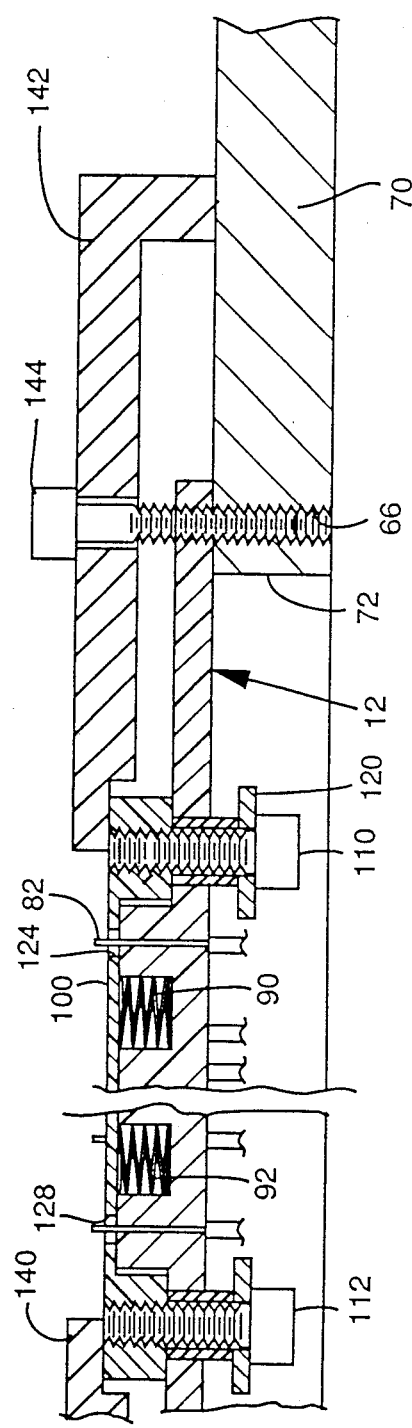
FIG. 5
FIG. 6

METHOD AND APPARATUS FOR TESTING INTEGRATED CIRCUITS

BACKGROUND OF THE INVENTION

1. Field of the Invention

This invention relates to methods and apparatus for testing integrated circuits and more particularly to such methods and apparatus which are used for automated testing of a plurality of integrated circuit chips mounted on an elongate flexible strip similar to motion picture film.

2. Description of the Related Art

One method of manufacture and testing of integrated circuits includes a process known as tape automated bonding. This process utilizes an elongate flexible strip similar to standard motion picture film upon which is deposited a thin layer of conductive material such as copper. This layer is photoetched to form a plurality of sequential lead frames which are substantially identical to one another. Next, an integrated circuit chip or die is bonded to the leads of each frame.

The strip typically includes a number of sprocket holes along each side thereof for engagement with rotating sprocket wheels which pull the strip, and the lead frames and associated die thereon, through different stages of the manufacture and testing process. Like motion picture film, the strip having the lead frames and die mounted thereon is wound onto and off of reels during the manufacturing and testing process. When the process is complete, the strip is cut into segments, each of which includes a lead frame and the die associated therewith, which are packaged to form the finished product.

The die are tested while on the strip to determine whether they meet operating specifications and to confirm that the electrical connections between the leads and the die are properly made. Such testing is accomplished by means of a probe test card which includes a plurality of probes extending downwardly therefrom. Each of the probes comprises a relatively fine wire against which a downward biasing force is applied.

In one configuration for testing, the strip, with the die directed upwardly, is pulled by the sprockets beneath the probe test card. The testing equipment periodically stops strip movement so that each die is temporarily positioned beneath the probe test card. When so positioned, the card lowers until each of the probes are biased against a test pad formed on the copper leads of the frame beneath the card. Thereafter, voltage is applied and measured via the probes to confirm that the die meets operating specifications and that the lead connections to the die are properly made. After so doing, the probe test card raises and the strip advances until the next die in sequence has stopped beneath the probe test card. The card again lowers to test the next adjacent die and lead connections as described above. The foregoing process is repeated until each of the die on the strip is tested.

The foregoing prior art method and apparatus suffers from several disadvantages. As noted above, the probes on the card are very fine and, depending upon the integrated circuit being tested, may number over 100 with relatively small spacing between probes. If the probe is bent so that the tip thereof is displaced a distance equal to the thickness of a human hair, the probe may not strike the test pad on the lead frame with which it is designed to make electrical contact. Under such circumstances, it is likely that testing will indicate a defective die and/or lead connection. Since the testing machine is equipped with a punch for excising defective circuits from the strip, a number of good die which are properly connected to their associated leads may be punched from the strip.

Probes are typically bent in one of two ways. First, as the strip starts and stops under control of the testing equipment, a misfeed may cause a slight buckle which elevates a section of the strip having test pads thereon. When the probe test card lowers, probes over the buckled strip are jammed into the strip, thus deflecting the same. Also, if even a small amount of strip movement should occur with probes contacting test pads, probes are likely to bend.

The automated testing process typically is stopped every one to two hours in order to correct damage to probes on the card.

SUMMARY OF THE INVENTION

The present invention comprises a method and apparatus for testing an integrated circuit of the type which is mounted on a flexible strip and which includes a die in electrical communication with a plurality of test pads formed on the strip. A selected strip segment having an integrated circuit die mounted thereon is positioned against a substantially flat strip support member. A portion of the strip is compressed against the strip support member and a test probe is urged against each of selected test pads. The integrated circuit is tested and thereafter the probes are lifted from the pads.

The apparatus of the present invention includes a substantially flat strip support member against which a selected strip segment having an integrated circuit formed thereon is positionable. A probe test card having a plurality of probes extending therefrom is movable between a first position spaced away from the strip support member and a second position in which the probes are in electrical contact with the test pads when the strip segment is so positioned. A compression member having a substantially flat surface is mounted on the probe card adjacent the probes and is constructed and arranged to compress a portion of the strip against the strip member when the probe card is in the second position.

The present invention also comprises a method of making a tester including the steps of creating at least one test pad opening in a plate which exposes selected test pads on the flexible strip when the plate is urged against the strip. A die opening is created in the plate which receives the die therein when the plate is urged against the flexible strip. The plate is mounted on a probe test card and plate movement is enabled between a first position in which the plate extends beyonds the test probes and a second position in which the probes in the probe test card extend through the test pad opening. The plate is biased toward the first position.

It is a general object of the present invention to provide a method and apparatus for testing an integrated circuit which overcomes the above-enumerated disadvantages of the prior art.

It is a more specific object of the present invention to provide such a method and apparatus which increases the integrated circuit yield by decreasing the number of circuits erroneously indicated as being defective.

It is another specific object of the present invention to provide such a method and apparatus which reduces testing equipment maintenance.

It is still another object of the present invention to provide such a method and apparatus which extends the life of the testing equipment.

It is yet another object of the present invention to provide such a method and apparatus which increases the rate of integrated circuit production and testing by reducing the downtime necessary for testing equipment maintenance.

It is another general object of the present invention to provide a method of making an integrated circuit tester which attains the above-enumerated objects.

The foregoing and other objects, features and advantages of the invention will become more readily apparent from the following detailed description of a preferred embodiment which proceeds with reference to the drawings.

BRIEF DESCRIPTION OF THE DRAWINGS

FIG. 3 is an enlarged partial view of the probe test head of FIG. 1 in a lower position relative to the flexible strip.

FIG. 5 is a view similar to FIG. 3 with the probes on the test head in contact with test pads on the flexible strip.

FIG. 6 is a view of the probe test head removed from its associated testing equipment (not shown in the drawings) and positioned for probe maintenance and repair.

DETAILED DESCRIPTION OF THE PREFERRED EMBODIMENT

Figure 1:
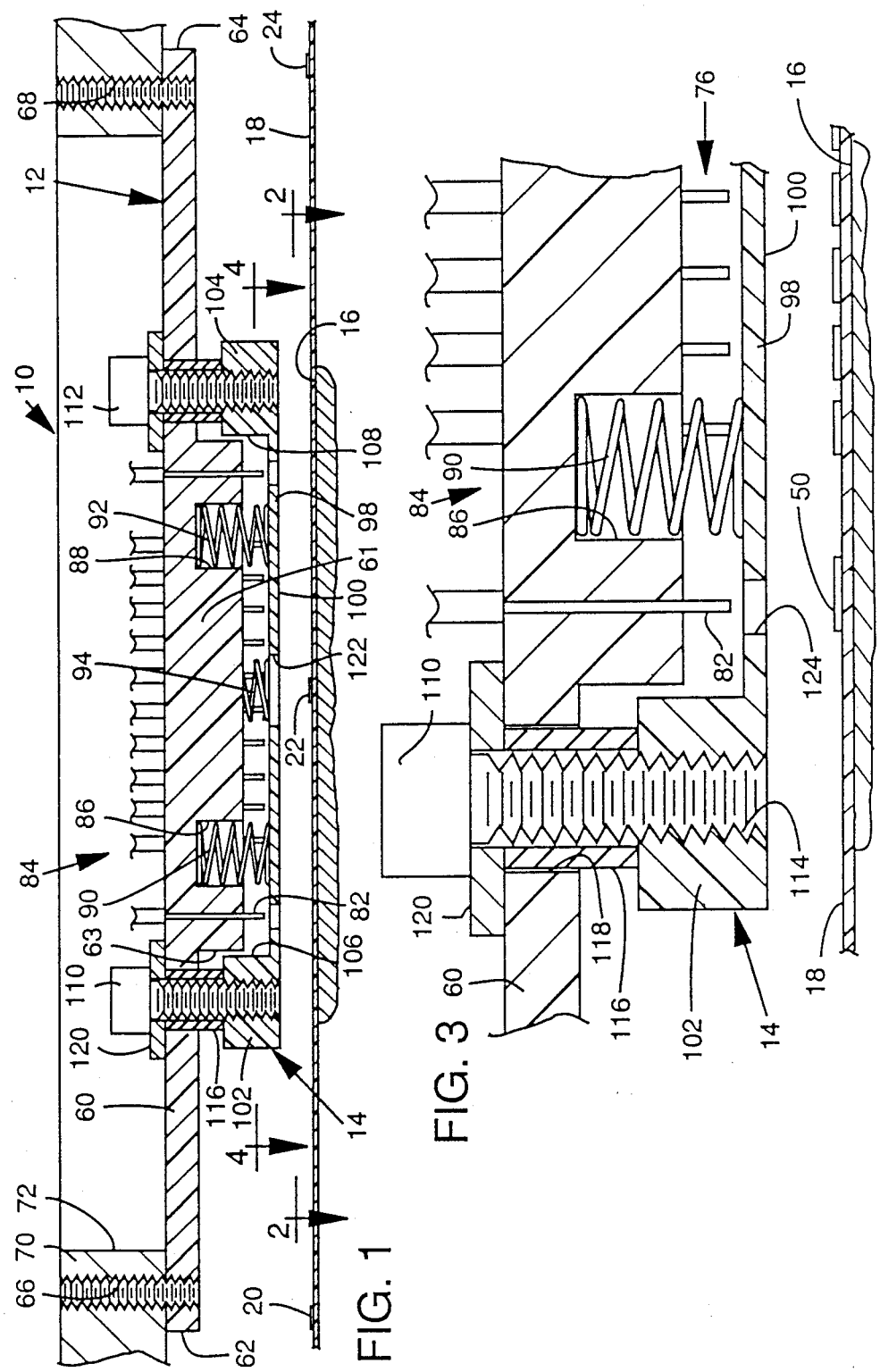
FIG. 1 is a side sectional view of a probe test head and an integrated circuit mounted on a flexible strip.

Referring to FIG. 1, indicated generally at 10 is a probe test head constructed in accordance with the present invention. The probe test head is mounted on conventional integrated circuit testing equipment (not visible) which is described below. Included therein is a probe test card 12, a probe guard plate 14 and a strip support member 16. The probe guard plate is referred to herein as a compression member and as a substantially planar plate.

Figure 2:
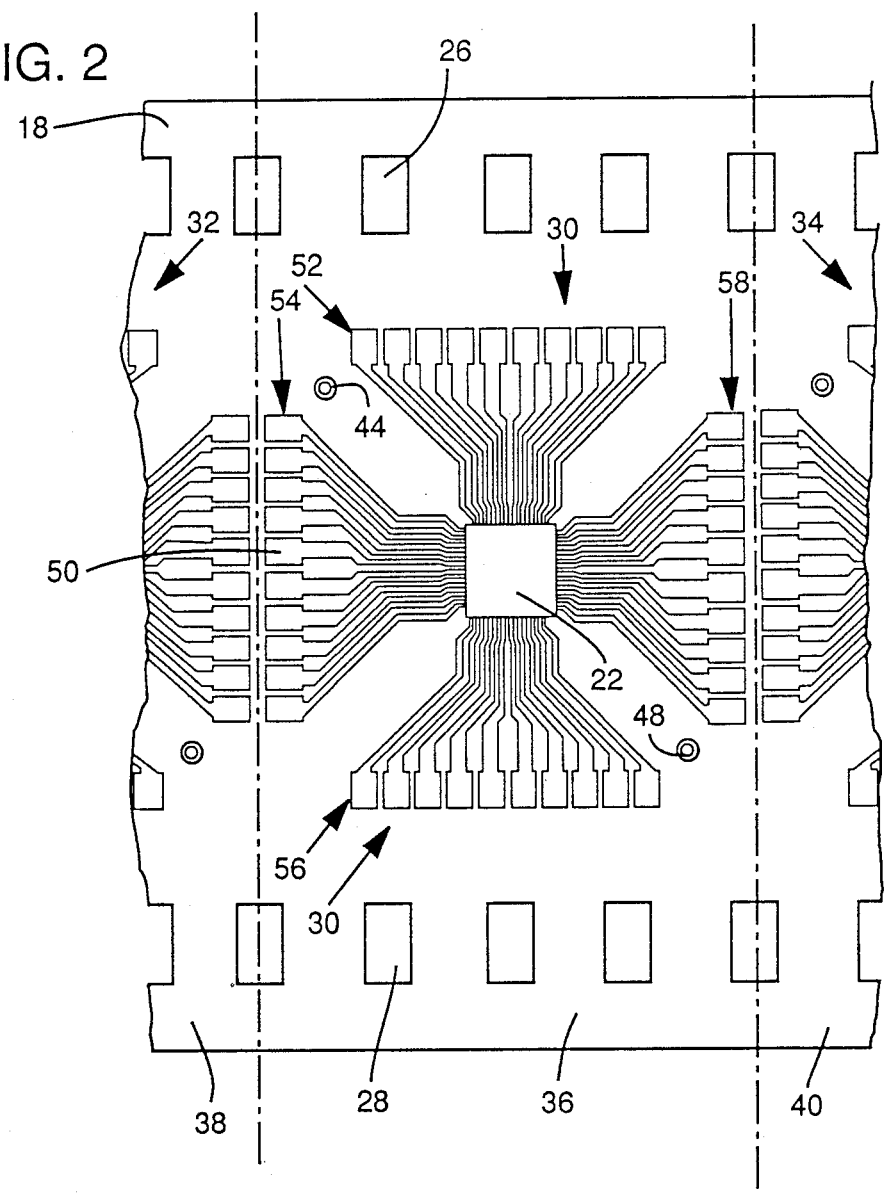
FIG. 2 is an enlarged partial view taken along line 2—2 in FIG. 1.

A flexible strip 18 is similar to motion picture film and includes mounted thereon three integrated circuit chips or die 20, 22, 24, with die 22 and a portion of strip 18 being best viewed in FIG. 2. Each of the die are substantially identical to one another and include the same circuit formed therein. Strip 18 has one end thereof wound onto a supply reel (not visible) mounted on the testing equipment to the left of die 20 in FIG. 1 and the other end mounted on a take-up reel (not visible), also mounted on the testing equipment, to the right of die 24. Strip 18 includes a plurality of equally-spaced sequential sprocket holes, like holes 26, 28, formed adjacent both sides thereof. These holes are engageable with rotatable sprocket wheels (not visible) in the testing equipment upon which probe test head 10 is mounted.

Rotation of the sprocket wheels pulls strip 18 across strip support member 16 and thereby unwinds the strip from the supply reel. The take-up wheel rotates as the strip moves thereby winding the strip onto the take-up wheel. The testing equipment periodically stops sprocket and take-up reel rotation so that each die is temporarily positioned in the position of die 22 in FIG. 1.

Turning attention again to FIG. 2, indicated generally at 30 is a lead frame to which die 22 is connected. The lead frame is formed on strip 18 by depositing a thin metallic layer on the strip and thereafter photoetching the layer to form the lead pattern shown in FIG. 2. Lead frames 32, 34, only a part of which are shown, are substantially identical to lead frame 30 and have die 20, 24, respectively, connected thereto in the same fashion that die 22 is connected to lead frame 30. Each of lead frames 30, 32, 34 and the die associated with each frame is on a separate segment 36, 38, 40, respectively, of strip 18. The dot-dashed lines in FIG. 2 indicate the boundaries between strip segments 36, 38, 40.

Lead frame 30 includes two annular pads 44, 48 which are not electrically connected to die 22 and which are used to align strip 18 with probe test head 10 in a manner which will be more fully explained hereinafter. A plurality of test pads, like test pad 50, are arranged in four rows 52, 54, 56, 58 to form a square on segment 36. Each of the test pads in rows 52, 54, 56, 58 is electrically connected to predetermined portions of the circuit in die 22. The die in each of the other segments on strip 18 are similarly connected to the lead frame associated therewith.

Consideration will now be given to the structure of probe test card 12, illustrated in FIGS. 1, 3, 4 and 5. The probe test card is mounted on a clear plastic board 60. Board 60 is substantially square and include a pair of opposing sides 62, 64 in FIG. 1. A second pair of opposing sides (not visible) define the other two sides of board 60. Board 60 includes a lower square portion 61 having a pair of opposing, substantially parallel sides 63, 65 viewable in FIG. 1. Sides 63, 65 are shown in dashed lines in FIG. 4 to illustrate a position which lower portion 61 assumes relative to probe guard plate 14 as will hereinafter be more fully explained. Opposing sides 67, 69 of square portion 61, also shown in phantom in FIG. 4, together with sides 63, 65 define the boundaries of lowered square portion 61.

The board is fixedly secured to a board support member 70 which includes a square opening 72 formed therein. Member 70 is movable vertically under control of testing equipment in a manner which will be explained hereinafter. A pair of threaded bores 66, 68 are formed through board 60 and member 70 as shown.

Four rows 74, 76, 78, 80 (in FIG. 4) of probes, one of which is probe 82 in row 74, extend downwardly from the underside of board 60. Each probe in rows 74–78 comprises a fine wire which extends through a vertical bore in lowered portion 61 of board 60. Each probe is received in a flexible tube, only a few of which are indicated generally at 84 in the drawing for the purpose of illustration.

Each of the tubes has one end abutted against the upper surface of board 60 and the other end secured to a plurality of brackets (not visible) mounted on member 70. Springs are disposed between each probe wire and its associated bracket to bias the probe wires downwardly as viewed in FIG. 1. Thus, if the probe wire abuts against structure during downward movement of member 70, the probe wire is urged upwardly while being biased downwardly against the structure.

Figure 4:
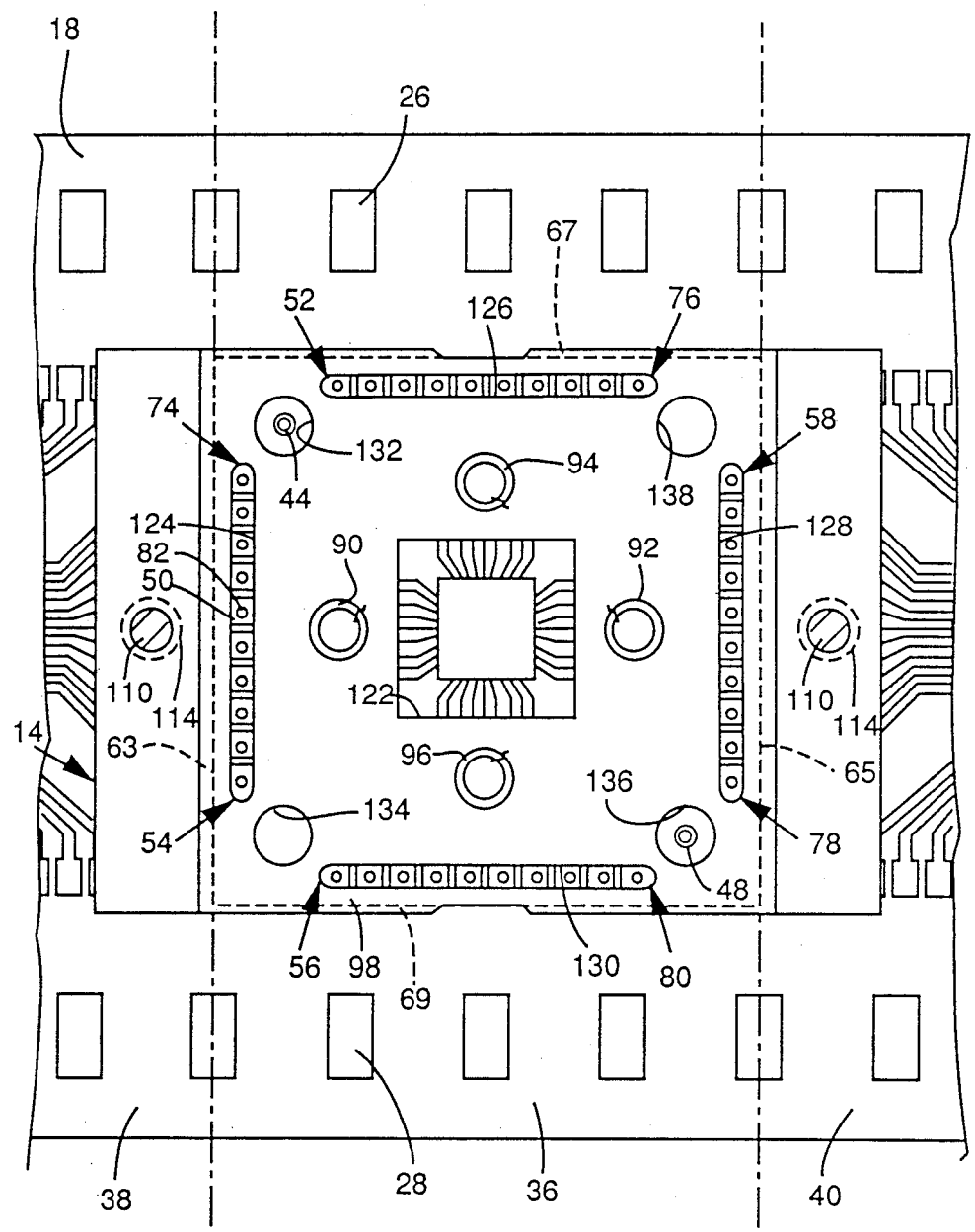
FIG. 4 is an enlarged partial view taken along 4—4 in FIG. 1.

Finishing now the description of probe card 12, four bores, two of which are bores 86, 88, are formed in the lower side of square portion 61. Bores 86, 88 each have a spring 90, 92 received therein. In the view of FIG. 1, each spring is compressed between the end of its associated bore and an upper surface of probe guard plate 14. Two additional bores (not visible) are formed on the underside of lowered square portion 61 and contain springs, one of which is spring 94, which are each biased against its associated bore end and guard plate 14 in the same manner that springs 88, 90 are. In FIG. 4, the lower portions of springs 90, 92, 94 are visible as is the lower portion of a spring 96 which is positioned beneath its associated bore (not visible) in square portion 61.

Consideration will now be given to the structure of probe guard plate 14 and to the manner in which it connects to probe test card 12. In the present embodiment of the invention, the guard is constructed of hard anodized aluminum, thus providing a guard which is light, flat (on the underside thereof) and strong and which does not conduct electricity. Guard plate 14 includes a substantially planar plate 98 having a flat surface 100 formed on the underside thereof.

A pair of opposed substantially parallel end members 102, 104 are formed on opposing ends of plate 14. Each end member includes an upright face 106, 108 which is substantially parallel to the adjacent side 63, 65, respectively, of lowered portion 61 on board 60. Each of end members 102, 104 includes a bolt 110, 112, respectively, which is threadably engaged in a bore, like bolt 110 is threadably engaged in threaded bore 114 in FIG. 3. A spacer 116 is received through a bore 118 formed through board 60 with the shaft of screw 110 being received through spacer 116. A washer 120 is disposed between the head of screw 110 and the upper surface of board 60. Screw 110 is tightened in bore 114 so that the screw, washer 120, spacer 116 and guard plate 14 do not move relative to one another.

Bolt 112 secures a substantially identical spacer and washer to end member 104 in the same manner as illustrated and described in connection with bolt 110.

Plate 98 (in FIG. 4) includes a substantially square opening 122 therethrough, such being referred to herein as a die opening. Four elongate probe openings 124, 126, 128, 130 are defined through plate 98 beneath each of probe rows 74, 76, 78, 80, respectively. Opening 124 is also viewable in FIG. 3.

Four circular holes 132, 134, 136, 138 are created through plate 98 near the corners thereof with the hole centers forming the corner of a square.

Considering now the operation of the preferred embodiment, with attention being directed to FIGS. 1-5, the testing equipment upon which probe test head 10 is mounted moves strip 18 to the right, as viewed in FIG. 1, as previously described. Strip 18 periodically stops thus temporarily positioning each die, like die 22, beneath die opening 122. Thereafter, member 70 moves downwardly, under control of the testing equipment, from the position of FIG. 1, to the position of FIG. 3. As downward movement continues, surface 100 abuts against the top surface of lead frame 30 on segment 36 of strip 18. After surface 100 so contacts the lead frame, continued downward movement compresses springs 90, 92, 94, 96 thereby compressing strip 18 and the lead frame thereon between the guard plate and strip support member 16. All of the foregoing occurs prior to the probe ends, like the lower end of probe 82, extending through their associated probe openings, like probe opening 124.

After the guard plate so compresses the strip, continued downward movement urges the probes through the probe opening on the guard plate beneath each probe row. With reference to FIG. 4, the probes in row 74 are received into probe opening 124 and the probes in rows 76, 78, 80 are received in probe openings 126, 128, 130, respectively. As downward movement of board 60 continues, the tips of each probe strike the test pad therebeneath, thus making electrical contact with the pad. Further downward movement of board 60 continues until the probes, like probe 82 in opening 124, are urged slightly upwardly relative to board 60 and against the biasing force applied to the probe. Each probe is thus biased against the test pad associated therewith, like probe 82 is biased against pad 50.

The biasing force of springs 90, 92, 94, 96 is high enough to fully compress any buckles which may raise portions of strip 18 in the event that the strip misfeeds as it moves. Thus, as the probes approach the strip, it is in a fully flattened condition and does not present raised surfaces against which a probe could be bent when board 60 moves to the position shown in FIG. 5.

With probe test head 10 and strip 18 in the configuration shown in FIG. 5, voltages can be applied to selected probes while the response of the integrated circuit is measured on other probes to determine whether or not die 22 meets operating specifications and whether or not the connections of lead frame 30 to the die are properly made.

When testing is complete, member 70 moves upwardly, under control of the testing equipment, thereby lifting the probes from the test pads. After the probes are completely removed from the test pads, the springs continue to bias guard plate 14 against strip 18 until the guard plate is in its fully lowered position. That is, the washers, like washer 120, associated with bolts 110, 112 are again abutted against the upper surface of board 60 so that the probe test head is in the condition shown in FIGS. 1 and 3 but with surface 100 of plate 98 still resting on the lead frames on strip 18. Thereafter, board 60 continues upward movement through the position of FIG. 3 and to the position shown in FIG. 1. It is to be appreciated that at all times during which the probes contact the test pads, guard plate 14 firmly compresses strip 18 against strip support member 16. Such compression begins prior to probe contact and continues after the probes are lifted from the pads. This feature prevents movement of strip 18 while the probes are touching the test pads thus preventing probe bending which might occur responsive to strip movement while the probes are biased against the test pads.

It should be noted that the foregoing can be accomplished by moving strip support member 16, and the strip supported thereon, toward the probe card while the probe card remains stationary or by moving both the probe card and strip support member toward one another.

After member 70 returns to the position of FIG. 1, strip 18 again moves to the right and stops with die 20 directly beneath die opening 122, i.e., in the same position as die 22 in FIG. 1. Member 70 again starts downward movement and the testing process as described above is repeated.

Pads 44, 48 in FIG. 4 permit alignment of strip 18 on support member 16. Such can be done by sighting through clear plastic board 60 and holes 132, 136 and thereafter moving the strip until it assumes the position, relative to guard plate 14, shown in FIG. 4.

Although not visible in the drawing, board 60 includes a pair of rings formed thereon which are used to precisely align the strip. The rings are essentially identical to pads 44, 48, but are slightly smaller in diameter in order to provide high alignment precision. For certain applications however, it might be desirable to have the diameters of the rings be approximately twice the diameters of the pads 44 and 48. When alignment is proper, pads 44, 48 are viewable through holes 132, 136, as shown in FIG. 4, and are centered in the rings (not visible) formed on board 60.

Turning attention now to FIG. 6, illustrated therein is probe test card 60 and support 70 removed from the testing equipment for probe repair. A pair of clamps 140, 142 are mounted on member 70 and probe test card 12 via bolts, one of which is bolt 144, received in bores 66, 68. The probe tips, like the tip of probe 82, are thus extended above plate 98 and are in position to have aligning forces applied thereto.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

We claim:

1. A method of testing integrated circuits of the type which are sequentially mounted on a flexible strip and which include a die in electrical communication with a plurality of test pads formed on the strip, said method comprising the steps of:
   positioning a selected strip segment having an integrated circuit die mounted thereon against a substantially flat strip support member;
   advancing the strip laterally relative to said strip support member until a selected integrated circuit is in position for testing;
   compressing a portion of the strip against the strip support member with a planar plate having an opening therein;
   permitting plate angulation relative to said strip support member;
   continuing such strip compression until lateral movement of said strip stops;
   inserting test probes into the plate opening after stopping strip movement responsive to plate compression;
   urging test probes so inserted against each of selected test pads;
   testing the integrated circuit; and
   lifting the test probes from the pads.

2. The method of claim 1 wherein said method further comprises the step of removing pressure from the strip.

3. The method of claim 1 wherein said plate includes a die opening therein of a size sufficient to receive the die and wherein the step of compressing a portion of the strip against the strip support member comprises the step of moving the plate toward the strip with the die received in said die opening and urging the plate against the strip.

4. The method of claim 3 wherein the step of compressing a portion of the strip the strip support member comprises the step of biasing the plate surface against the strip.

5. A method of making a tester for an integrated circuit of the type which is mounted on a flexible strip and which includes a die in electrical communication with a plurality of test pads formed on the strip, said method comprising the steps of:
   creating at least one test pad opening in a plate which exposes selected test pads on the flexible strip when said plate is urged against the strip, said opening being of a size to receive test probes therethrough without touching said plate;
   creating a die opening in the plate which receives the die therein when said plate is urged against the flexible strip;
   mounting the plate on a probe test card;
   enabling plate angulation relative to said probe test card;
   enabling plate movement between a first position in which said plate extends entirely beyond a plurality of probes on said probe test card and a second position in which the probes extend through said test pad opening; and
   biasing the plate towards said first position.

6. A method of testing integrated circuits of the type which are sequentially mounted on a flexible strip and which includes a die in electrical communication with a plurality of test pads formed on the strip, said method comprising the steps of:
   providing a probe test card of the type having a plurality of probes extending downwardly from the underside thereof;
   mounting a planar plate having an opening therein on the underside of said probe test card;
   permitting plate angulation relative to said probe test card;
   laterally advancing a selected strip segment having an integrated circuit die mounted thereon over a substantially flat strip support member;
   lowering the probe test card or raising the strip support member until said plate compresses a portion of the strip against the strip support member;
   further lowering the probe test card or raising the strip support member until lateral movement of said strip stops;
   still further lowering the probe test card or raising the strip support member until said test probes are inserted into said opening;
   urging test probes so inserted against selected test pads;
   testing the integrated circuit;
   raising the probe test card or lowering the strip support member until the probes are above said plate; and
   further raising the probe test card or lowering the strip support member until the compression member no longer compresses the strip.

7. The method of claim 6 wherein the step of mounting a planar plate having an opening therein on the underside of said probe test card comprises the steps of:
   mounting a plate on the lower side of the probe test card substantially parallel thereto;
   enabling plate movement between a lower position in which the tips of probes extending from the underside of the probe test card are above the upper surface of the plate and an upper position in which the probe tips extend beneath the lower surface of the plate; and
   biasing the plate to the lower position.

8. The method of claim 7 wherein said method further comprises the step of exposing the probes for repair or adjustment by clamping the planar plate in said upper position.

9. The method of claim 6 wherein the step of still further lowering the probe test card or raising the strip support member until said test probes are inserted into said openings comprises the step of lowering said plate until said die is received in an opening formed therein.

10. The method of claim 6 wherein said method further comprises the step of registering said strip with said probe test card.

11. The method of claim 10 wherein said strip includes a pair of alignment marks, said probe test card includes a corresponding pair of alignment marks, said plate includes a pair of corresponding openings and wherein the step of registering said strip with said probe test card comprises the steps of:
  sighting said strip alignment marks through said compression member openings; and
  aligning the strip alignment marks with the board alignment marks.

12. Apparatus for testing an integrated circuit of the type which is mounted on a flexible strip and which includes a die in electrical communication with a plurality of test pads formed on the strip, said apparatus comprising:
  a substantially flat strip support member against which a selected strip segment having an integrated circuit formed thereon is positionable;
  a probe test card having a plurality of test probes extending therefrom, said card and said support member being movable relative to one another between a first position in which said card is spaced away from said strip support member and a second position in which the tips of said probes are in electrical contact with said test pads when a strip segment is so positioned;
  a planar plate mounted on said probe card adjacent said probes, said plate being movable between a first position in which said plate extends beyond the tips of said probes and a second position in which said plate compresses a portion of the strip against said strip support member when said probe card is in said second position;
  means for permitting plate angulation relative to said strip support member when said plate is in its second position; and
  an opening in said plate through which said probe tips pass as said plate moves from its first position to its second position, said opening being of a size sufficient to prevent probe contact with said plate for all operating conditions of said apparatus.

13. The apparatus of claim 12 wherein said plate further includes means for compressing a portion of said strip against said strip support member as said probe card and said strip support member move relative to one another from said first probe card position to said second probe card position and prior to the tips of said probes entering said openings.

14. The apparatus of claim 12 wherein said apparatus further includes means for biasing said plate to said first plate position.

15. The apparatus of claim 12 wherein said plate includes a die opening therein of a size sufficient to receive said die when said plate so compresses a portion of said strip.

16. The apparatus of claim 12 wherein apparatus further includes:
  a pair of alignment marks formed on said strip;
  a pair of corresponding alignment marks formed on said probe test card; and
  a pair of openings formed in said compression member for permitting sighting of said strip alignment marks therethrough and thereafter alignment of said strip marks with said test card marks.

17. A test probe guard for use with an integrated circuit tester of the type having a test probe card which is movable between a first position spaced away from a flexible strip having a die and a plurality of test pads mounted thereon and a second position in which the tips of test probes on the card are in electrical contact with the test pads, said guard in operative condition comprising:
  a substantially planar plate mounted on said test probe card adjacent said test probes for compressing said flexible strip as said card moves from said first position to said second position;
  means for enabling plate travel toward and away from said test probe card;
  means for enabling plate angulation relative to said probe test card;
  means for limiting maximum plate travel away from said test probe card to a first plate position in which said plate extends beyond the tips of said test probes;
  means for limiting maximum plate travel toward said test probe card to a second plate position in which the tips of test probes on said card extend beyond said plate;
  means for biasing said plate toward said first plate position; and
  an opening in said plate through which said probe tips pass as said plate moves from its first position to its second position, said opening being of a size sufficient to prevent probe contact which said plate for all operating conditions of said test probe guard.

18. The guard of claim 17 wherein said biasing means is constructed and arranged to bias said plate against said flexible strip as said test probe card moves from its first position to its second position and prior to said probes entering said plate opening.

19. The guard of claim 17 wherein said plate further includes an opening in which said die is received when said plate is biased against said flexible strip and said probes are in electrical contact with said test pads.

20. The guard of claim 17 wherein the surface of said plate which compresses said flexible strip is formed from nonconductive material.

21. A method of testing an integrated circuit of the type which is mounted on a flexible strip and which includes a die in electrical communication with a plurality of test pads formed on the strip, said method comprising the steps of:
  providing a probe test card of the type having a plurality of probes extending downwardly from the underside thereof:
  mounting a plate on the lower side of the probe test card substantially parallel thereto;
  enabling plate movement between a lower position in which the probes extending from the underside of the probe test card are above the lower surface of the plate and an upper position in which the probes extend beneath the lower surface of the plate;
  biasing the plate to the lower position;
  positioning a selected strip segment having an integrated circuit die mounted thereon over a substantially flat strip support member;
  lowering the probe test card or raising the strip support member until the flat surface of said compression member compresses a portion of the strip against the strip support member;

further lowering the probe test card of raising the strip support member until the probes are in electrical contact with selected test pads;

testing the integrated circuit;

raising the probe test card or lowering the strip support member until the probes are no longer in contact with the test pads;

further raising the probe test card or lowering the strip support member until the compression member no longer compresses the strip; and exposing the probes for repair or adjustment by clamping the plate in said upper position.

* * * * *